(12) United States Patent
Hwang et al.

(10) Patent No.: US 10,849,226 B2
(45) Date of Patent: Nov. 24, 2020

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Mi-Sun Hwang, Suwon-si (KR); Hye-Won Jung, Suwon-si (KR); Jae-Sung Sim, Suwon-si (KR); Byung-Duk Na, Suwon-si (KR); Hee-Joon Chun, Suwon-si (KR); Sun-A Kim, Suwon-si (KR); Deok-Man Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/663,419

(22) Filed: Oct. 25, 2019

(65) Prior Publication Data

US 2020/0178392 A1 Jun. 4, 2020

(30) Foreign Application Priority Data

Dec. 4, 2018 (KR) .......................... 10-2018-0154324

(51) Int. Cl.
*H05K 1/11* (2006.01)
*H05K 3/00* (2006.01)
(52) U.S. Cl.
CPC ........... *H05K 1/116* (2013.01); *H05K 3/0017* (2013.01); *H05K 2201/096* (2013.01);
(Continued)
(58) Field of Classification Search
CPC ........... H05K 3/0017; H05K 2203/025; H05K 2201/096; H05K 2201/09509; H05K 2201/09736; H05K 2201/09454; H05K 2201/2072; H05K 2201/09563; H05K 1/111–116; H05K 3/4661; H05K 3/384; H05K 2201/0212; H05K 3/383; H05K 2203/0307; H05K 2203/1157; H05K 2203/0789; H05K 2203/0796; H05K 3/282; H05K 3/385; H05K 2203/124; H05K 2203/072; H05K 2203/0315; H05K 2203/0392; Y10S 428/901;
(Continued)

(56) References Cited

U.S. PATENT DOCUMENTS 5,277,787 A * 1/1994 Otani ..................... H05K 1/113
205/125
6,348,737 B1 * 2/2002 Advocate, Jr. .... H01L 23/49827
257/773
(Continued)

FOREIGN PATENT DOCUMENTS

JP H10-050209 2/1998
JP 5005416 B2 8/2012
(Continued)

*Primary Examiner* — Steven T Sawyer
(74) *Attorney, Agent, or Firm* — NSIP Law

(57) ABSTRACT

A printed circuit board includes: an insulating layer having a via hole formed therein; a single layer metal pad disposed in the insulating layer and having a center portion that is exposed by the via hole, the center portion of the pad having a higher roughness than peripheral portions of the pad; and a via formed in the via hole and connected to the center portion of the pad.

10 Claims, 8 Drawing Sheets

(52) U.S. Cl.
CPC .............. *H05K 2201/09454* (2013.01); *H05K 2201/09509* (2013.01); *H05K 2201/09736* (2013.01); *H05K 2203/025* (2013.01)

(58) Field of Classification Search
CPC ..... Y10T 428/31529; Y10T 428/31681; Y10T 428/24273; Y10T 428/24917
See application file for complete search history.

(56) References Cited

U.S. PATENT DOCUMENTS

| | | | | |
|---|---|---|---|---|
| 8,027,169 | B2* | 9/2011 | Niki | H05K 1/115 |
| | | | | 174/255 |
| 2002/0004982 | A1* | 1/2002 | Haze | H05K 3/385 |
| | | | | 29/852 |
| 2003/0080408 | A1* | 5/2003 | Farnworth | H05K 1/112 |
| | | | | 257/698 |
| 2008/0257595 | A1* | 10/2008 | Hu | H01L 24/11 |
| | | | | 174/261 |
| 2011/0155439 | A1* | 6/2011 | Yamada | H05K 3/4652 |
| | | | | 174/264 |
| 2014/0097009 | A1* | 4/2014 | Kaneko | H05K 3/4682 |
| | | | | 174/258 |
| 2014/0264841 | A1* | 9/2014 | Lin | H01L 24/13 |
| | | | | 257/737 |
| 2014/0353025 | A1* | 12/2014 | Jang | H05K 3/0035 |
| | | | | 174/262 |
| 2015/0008020 | A1* | 1/2015 | Kaneko | H05K 3/465 |
| | | | | 174/257 |
| 2016/0020163 | A1* | 1/2016 | Shimizu | H01L 23/49822 |
| | | | | 361/768 |
| 2016/0174372 | A1* | 6/2016 | Inagaki | H05K 1/113 |
| | | | | 174/251 |
| 2017/0207148 | A1* | 7/2017 | Kasahara | H01L 21/4821 |
| 2018/0337117 | A1* | 11/2018 | Nishihara | H01L 22/10 |

FOREIGN PATENT DOCUMENTS

| | | |
|---|---|---|
| JP | 5602584 B2 | 10/2014 |
| KR | 10-2008-0017496 A | 2/2008 |

* cited by examiner

PRINTED CIRCUIT BOARD AND METHOD OF MANUFACTURING THE SAME

CROSS-REFERENCE TO RELATED APPLICATION

This application claims the benefit under 35 USC 119(a) of Korean Patent Application No. 10-2018-0154324, filed on Dec. 4, 2018, the entire disclosure of which is incorporated herein by reference for all purposes.

BACKGROUND

1. Field

The following description relates to a printed circuit board and a method of manufacturing the same.

2. Description of Background

Along with the miniaturization and thin-filming of electronic devices such as a mobile device and a notebook, there is an increasing demand for small and thin printed circuit boards.

In order to form vias which connect layers in a thin printed circuit board, an efficient processing technique for via holes is required. In addition, vias having excellent electrical and mechanical properties are in demand.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: an insulating layer having a via hole formed therein; a single layer metal pad disposed in the insulating layer and having a center portion that is exposed by the via hole, the center portion of the pad having a higher roughness than peripheral portions of the pad; and a via formed in the via hole and connected to the center portion of the pad.

The center portion of the pad may be concave on one surface.

The via hole may include a pair of via holes formed in the insulating layer to face each other to expose both surfaces of the center portion of the pad, both surfaces of the center portion of the pad may be concave, and the via may include a pair of vias connected to the center portion of the pad to face each other.

The via hole may include a pair of via holes formed in the insulating layer to face each other to expose both surfaces of the center portion of the pad, the center portion of the pad may a flat surface opposite the one surface, and the via may include a pair of vias connected to the center portion of the pad to face each other.

The via hole may include a pair of via holes formed in the insulating layer to face each other to expose both surfaces of the center portion of the pad, the center portion of the pad may have a convex surface opposite the one surface, and the via may include a pair of vias connected to the center portion of the pad to face each other.

In another general aspect, a method of manufacturing a printed circuit board includes: preparing an insulating layer with a pad buried in the insulating layer; selectively removing the insulating layer using a sandblasting process to form a via hole exposing a center portion of the pad such that the center portion of the pad has a higher roughness than peripheral portions of the pad; and filling the via hole with a metal material to form a via.

The forming of the via hole may include stacking a sandblast mask, which has a through hole corresponding to a location of the via hole, on the insulating layer; and performing the sandblasting process on the insulating layer on which the sandblast mask is stacked.

The forming of the via hole may include performing the sandblasting process on both surfaces of the insulating layer and forming a pair of via holes to face each other to expose both surfaces of the center portion of the pad, and the forming of the via hole may include forming a pair of vias connected to the center portion of the pad to face each other.

The sandblasting process may be simultaneously performed on both surfaces of the insulating layer.

The sandblasting process may be sequentially performed on a first surface and a second surface of the insulating layer.

In another general aspect, a printed circuit board includes: an insulating layer; a pad disposed in the insulating layer and including a first surface having a first center portion that is rougher than peripheral portions of the first center portion and a second surface having a second center portion that is rougher than peripheral portions of the second center portion; a first via penetrating the insulating layer and connected to the first center portion of the pad; and a second via penetrating the insulating layer and connected to the second center portion of the pad.

The first center portion of the pad may be concave toward the second center portion of the pad, and the second center portion of the pad may be concave toward the first center portion of the pad.

The first center portion of the pad may concave toward the second center portion of the pad, and the second center portion of the pad may be relatively flat.

The first center portion of the pad may be concave toward the second center portion of the pad, and the second center portion of the pad may be convex away from the first center portion of the pad.

A concave shape of the first center portion may correspond to a convex shape of the second center portion.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
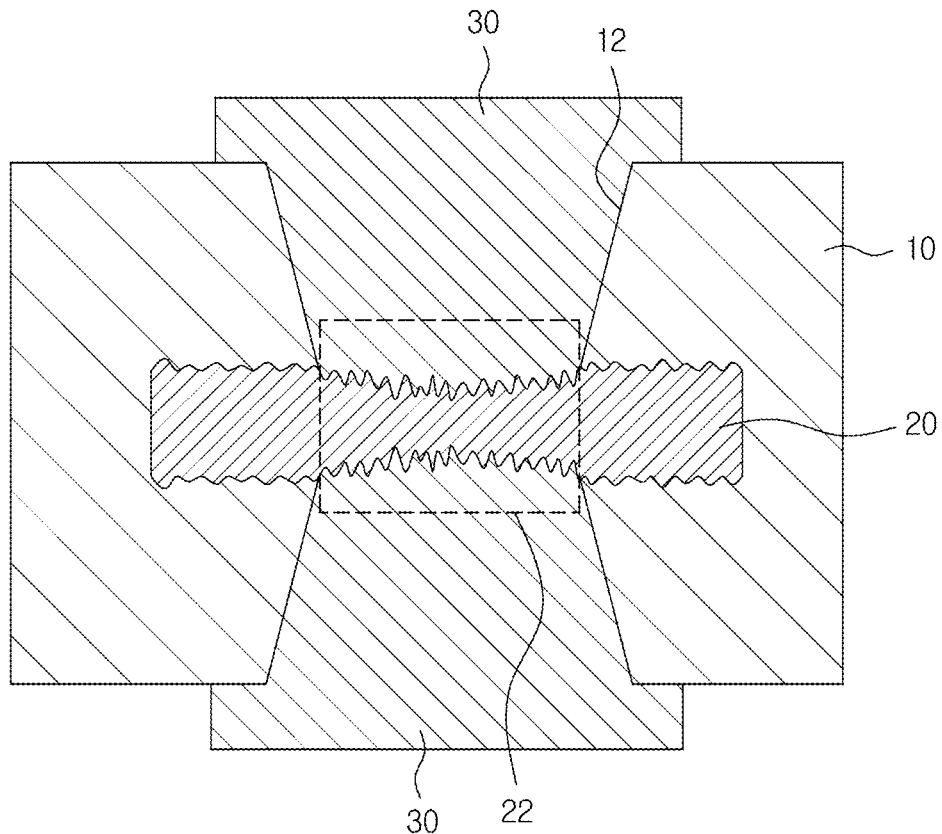
FIG. 1 is a diagram showing a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
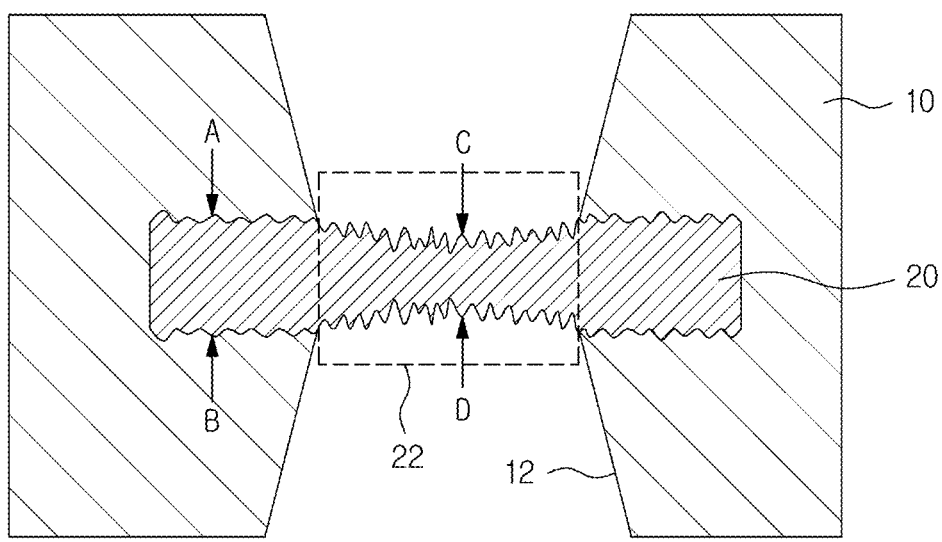
FIGS. 2 and 3 are diagrams illustrating a pad of a printed circuit board according to an example.
Figure 3:
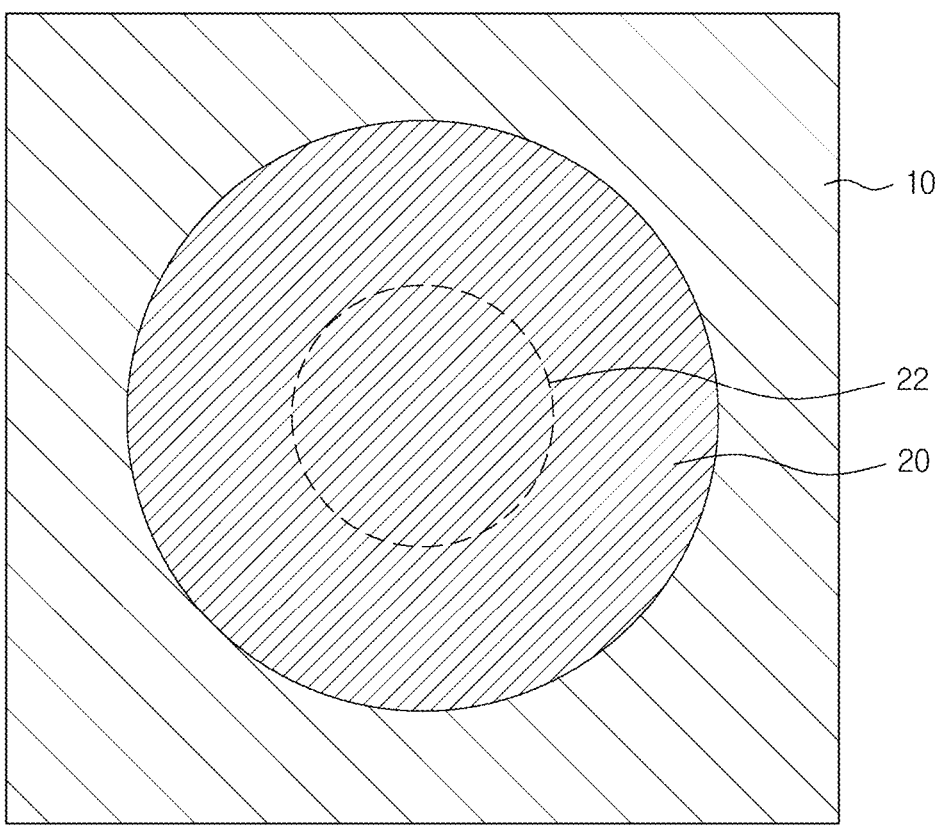
Figure 4:
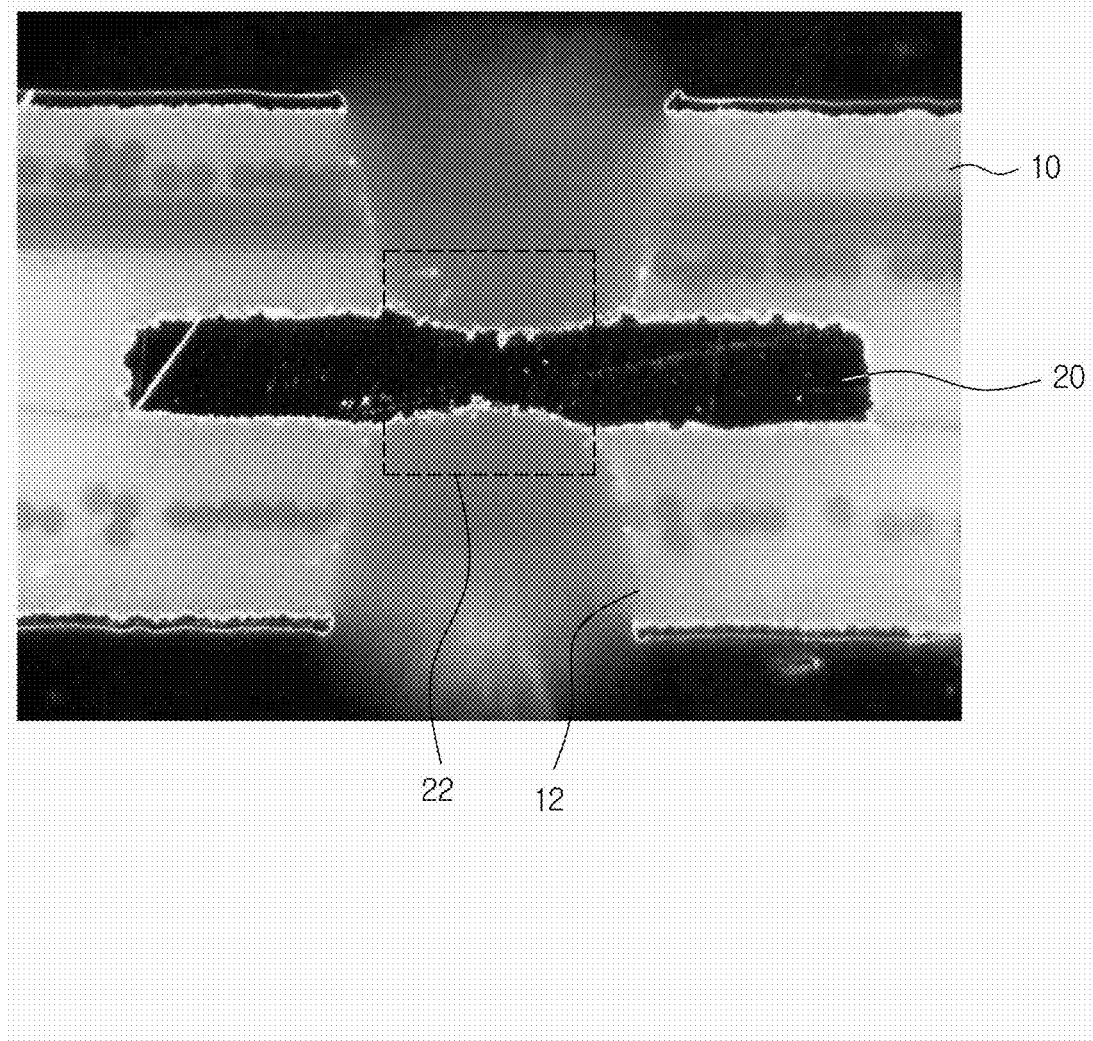
FIG. 4 is a photograph showing a via hole of a printed circuit board according to an example.

FIG. 1 is a diagram showing a printed circuit board (PCB) according to an example, FIGS. 2 and 3 are diagrams illustrating a pad of the PCB, and FIG. 4 is a photograph showing a via hole of the PCB.

Referring to FIG. 1, the PCB includes an insulating layer 10, a pad 20, and a via 30.

The insulating layer 10 is formed by stacking insulating materials, and a circuit pattern including the pad 20 may be formed in the insulating layer 10. For interlayer connection of the circuit pattern, a via hole 12 to be filled with the via 30 may be formed in the insulating layer 10.

Referring to FIG. 1, the pad 20 may be disposed inside the insulating layer 10. Via holes 12 may be formed on both surfaces of the insulating layer 10, and both surfaces of the pad 20 may be exposed through the via holes 12 formed on both surfaces of the insulating layer 10.

The insulating layer 10 may include a variety of insulating materials such as a thermosetting resin, a photosensitive resin, and the like. In order to improve mechanical properties and electrical properties such as strength, a thermal expansion rate, and the like, the insulating layer 10 may include various reinforcing materials such as fibers, fillers, and the like.

The insulating layer 10 may be formed on another insulating layer or may be formed as a portion of a build-up layer including several insulating layers.

The pad 20 is a portion of the circuit pattern, and is disposed in the insulating layer 10 and connected to the via 30. The pad 20 may be formed by various circuit pattern forming methods such as plating. The pad 20 may be formed as a single metal layer and have a center portion 22 exposed by the via hole 12 of the insulating layer 10. The pad 20 may have a structure in which the center portion 22 has a higher roughness than peripheral portions.

Referring to FIGS. 2 to 4, the pad 20 may be disposed in a central portion of the insulating layer 10. The center portion 22 of the pad 20 may be exposed through the via hole 12 while the via hole 12 is not filled with the via 30. The center portion 22 exposed through the via hole 12 may have a higher roughness than a buried peripheral portion of the insulating layer 10. The via 30 is tangentially connected to the center portion 22 of the pad 20, and thus the high roughness of the center portion 22 may serve to increase coupling strength of the via 30 to the pad 20.

The center portion 22 may have a surface formed to be concave, and the concave surface may be formed to have a high roughness. That is, the concave surface of the center portion 22 may have a higher roughness than a portion outside the concave surface. Referring to FIG. 2, a thickness (C-D distance) of the center portion 22 of the pad 20 is formed to be smaller than a thickness (A-B distance) of the peripheral portion of the pad 20, and thus a concave surface may be formed in the center portion 22 of the pad 20.

The concave surface of the center portion 22 widens a surface area to be coupled to the via 30 and also allows the via 30 to be inserted into and coupled to the pad 20 and thus may serve to increase coupling strength of the via 30 to the pad 20. The concave surface may be formed on one or both surfaces of the pad 20.

The via 30 is formed in the via hole 12 of the insulating layer 10 and connected to the pad 20. The via 30 may be formed by plating the via hole 12 with a metal or by filling the via hole 12 with a conductive paste.

Referring to FIG. 1, an end of the via 30 may be coupled to the concave center portion 22 of the pad 20. The center portion 22 has a high roughness, and thus a metal constituting the via 30 may be inserted into and coupled to a valley formed on the surface of the center portion 22 of the pad 20. Accordingly, this structure increases the coupling strength of the via 30 to the pad 20.

In particular, both surfaces of the center portion 22 of the pad 20 are formed to be concave, and both concave surfaces of the center portion 22 are exposed by the via hole 12. A pair of vias 30 may be connected to both surfaces of the center portion 22 to face each other. Accordingly, circuit patterns disposed on both surfaces of the insulating layer 10 may be reliably connected to each other through the pad 20 and the pair of vias 30.

Figure 5:
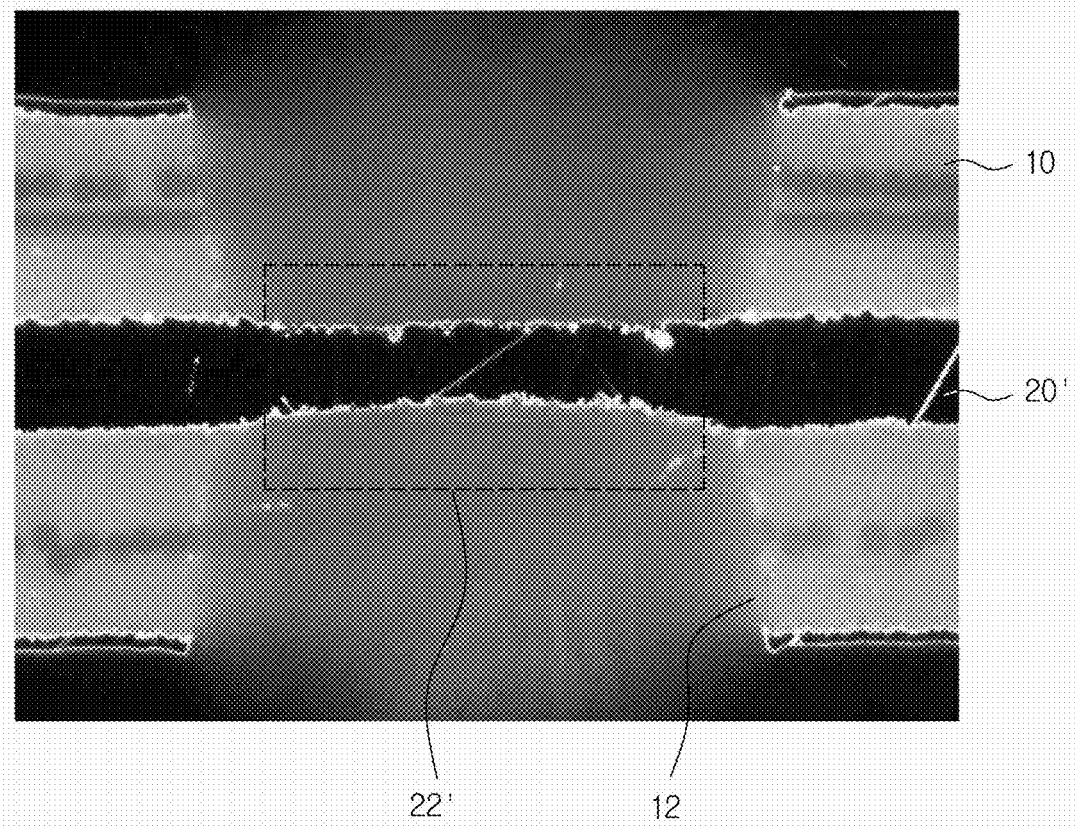
FIG. 5 is a photograph showing a via hole of a printed circuit board according to an example.

FIG. 5 is a photograph showing a via hole of a PCB according to another example.

Referring to FIG. 5, a concave surface may be formed on only one surface of a pad 20'. In the pad 20', a center portion 22' may have one surface formed to be concave and the other surface formed to be relatively flat. Even in this case, a pair of vias may be connected to both surfaces of the center portion 22' to face each other.

Figure 6:
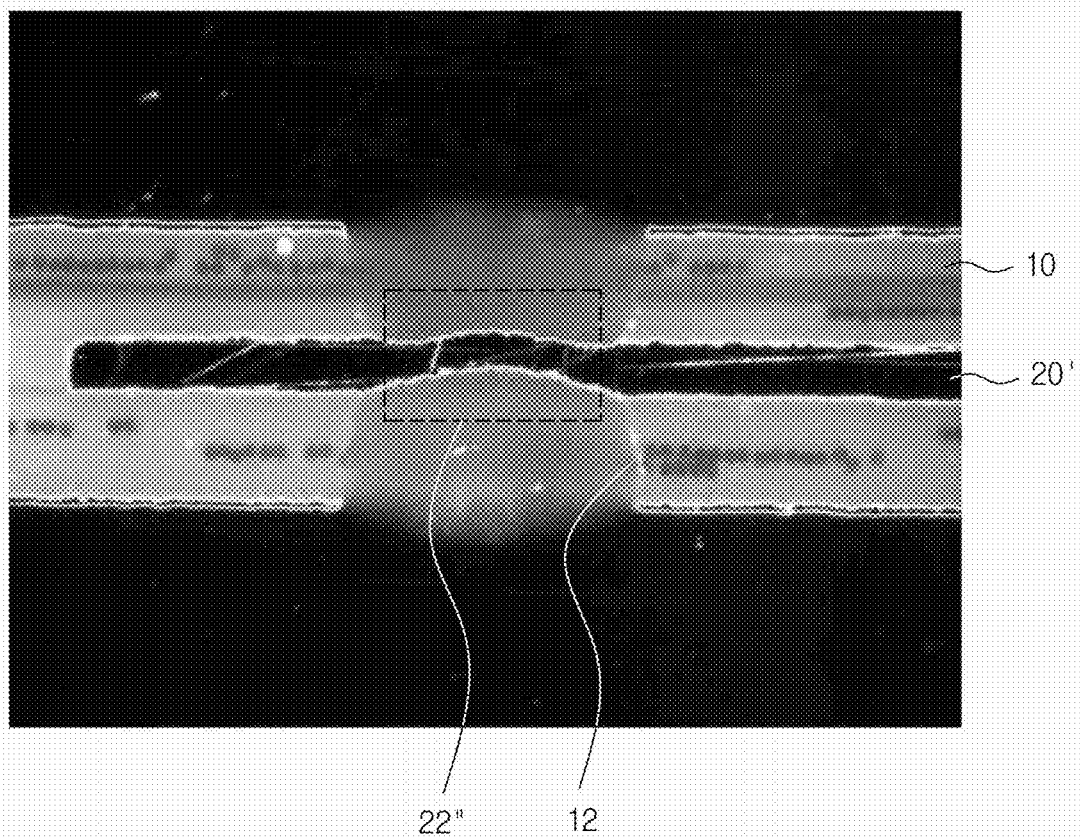
FIG. 6 is a photograph showing a via hole of a printed circuit board according to an example.

FIG. 6 is a photograph showing a via hole of a PCB according another example.

Referring to FIG. 6, a pad 20" may have one surface formed to be concave and the other surface formed to be convex. In the pad 20", a center portion 22" may have one surface formed to have a concave shape and the other surface formed to have a convex shape corresponding to the concave shape. That is, the center portion 22" of the pad 20" may be entirely formed in an arch structure. In this case, a via is connected to each of the concave surface and the convex surface, that is, a pair of vias may be connected to the center portion 22" to face each other. The convex surface widens a surface area to be coupled to the via and also allows the via to be inserted into and coupled to the pad 20", and thus may serve to increase coupling strength of the via to the pad 20".

Figure 7:
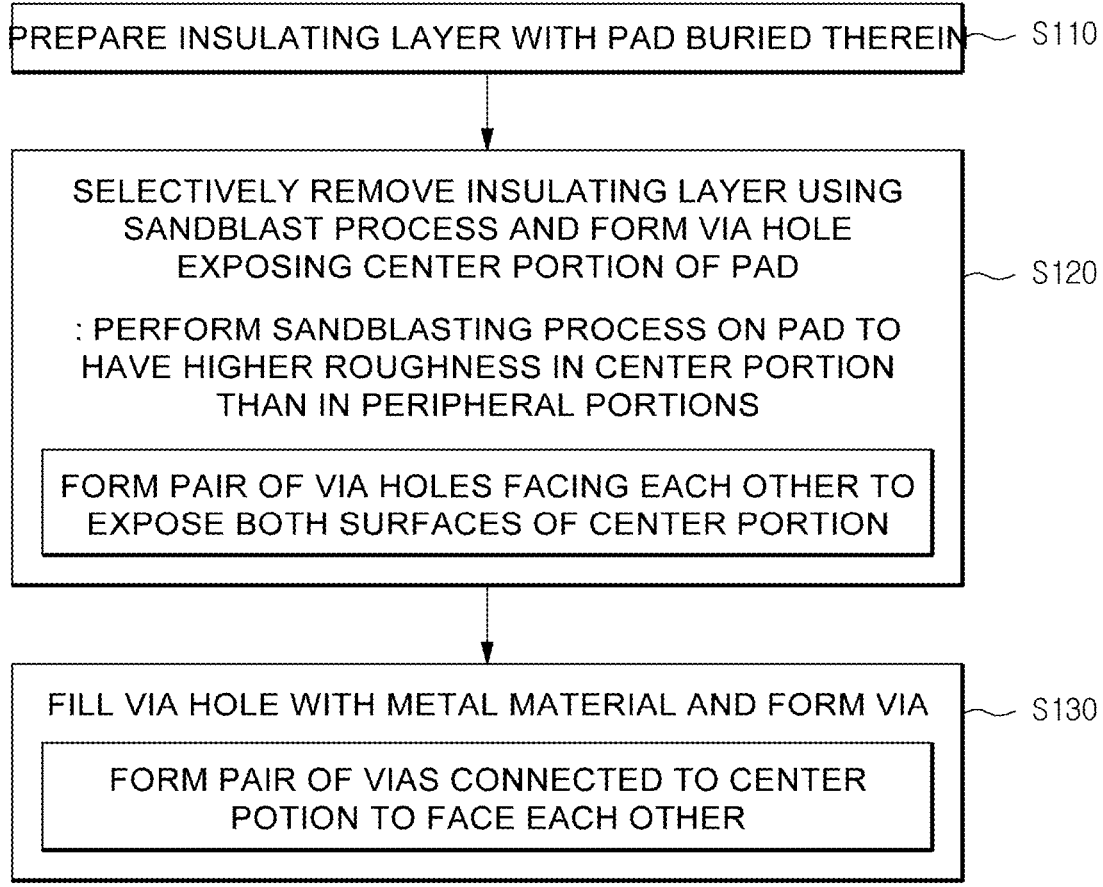
FIG. 7 is a flowchart showing a method of manufacturing the printed circuit board according to an example.

FIG. 7 is a flowchart showing a method of manufacturing the PCB according to an example, and FIGS. 8 to 11 are diagrams illustrating a method of manufacturing the PCB according to an example.

Referring to FIGS. 7 to 11, the method of manufacturing the PCB includes preparing an insulating layer 110 (S110), forming a via hole 112 (S120), and forming a via 130 (S130).

The preparing of the insulating layer 110 (S110) includes preparing the insulating layer 110 in which a pad 120 is buried.

Figure 8:
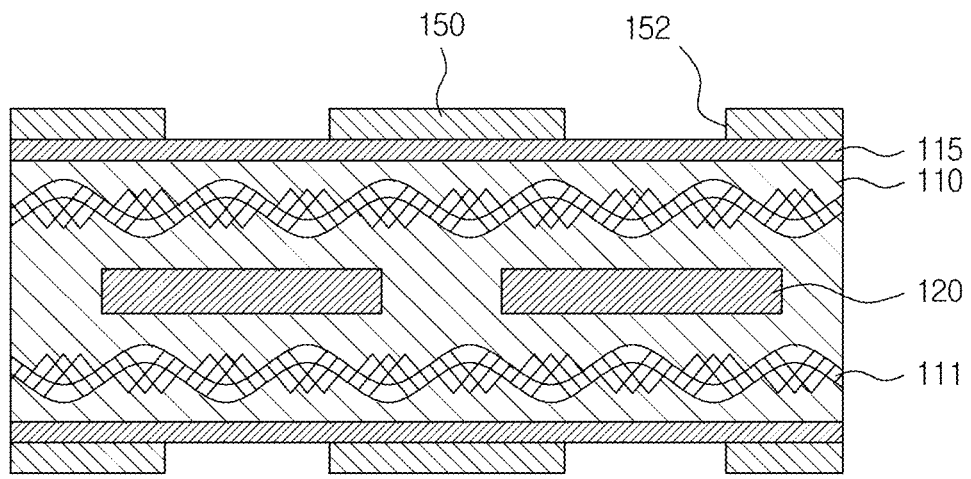
FIGS. 8, 9, 10, and 11 are diagrams illustrating a method of manufacturing a printed circuit board according to an example.

Referring to FIG. 8, the insulating layer 110 having the pad 120 disposed at a central portion thereof may be formed. The insulating layer 110 may be formed by stacking a variety of insulating materials such as a thermosetting resin, a photosensitive resin, and the like. In order to improve mechanical properties and electrical properties such as strength, a thermal expansion rate, and the like, the insulating layer 110 may include various reinforcing materials 111 such as fibers, fillers, and the like.

After the insulating layer 120 is formed by stacking insulating materials, the pad 120 is buried in the insulating layer 110. A metal layer 115 may be stacked on both surfaces of the insulating layer 110. Subsequently, the metal layer 115 may be selectively etched to form a circuit pattern.

In this example, a method of preparing the insulating layer 110 by forming the pad 120 on an insulating material and then stacking an insulating material again on the pad 120 is illustrated, but the method is not limited thereto and various methods of forming the pad 120 on/in the insulating layer 110 are included. The pad 120 may be formed using plating and various circuit pattern forming methods (e.g., metal paste sintering).

The forming of the via hole 112 (S120) includes selectively removing the insulating layer 110 using a sandblasting process and forming the via hole 112 which exposes the pad 120. Further, the sandblasting process is also performed on the pad 120 to have a higher roughness in the center portion 122 of the pad 120 than in peripheral portions of the pad 120.

The sandblasting process is a process of spraying an abrasive material from a nozzle to grind or cut a material surface. In conventional methods, since sand was sprayed as the abrasive material, the process was named "sandblasting." However, at present, various particles such as ceramic powder, including as alumina (aluminum oxide) or silicon carbide, glass beads, plastic powder and the like may be used as the abrasive material. There are two types of sandblasting: wet sandblasting that mixes an abrasive material and water and then sprays the mixture from a nozzle; and air sandblasting that sprays only the abrasive material from a nozzle using air.

For example, in this example, particles 155 such as silicon carbide may be used as the abrasive material for the sandblasting process. The via hole 112 exposing the pad 120 may be formed by spraying the particles 155 on a portion of the insulating layer 110 with the pad 120 buried therein to form a hole in the insulating layer 110.

When the via hole 112 is formed in the insulating layer 110 by performing the sandblasting process, a wall surface with a low surface roughness may be formed in the via hole 112, and the reinforcing material 111 of the insulating layer 110 may be smoothly processed without protruding from the wall surface of the via hole 112. Thus, since the outer surface of the via 130 formed in the via hole 112 has a low roughness, the loss of signals transferred through the via 130 may be reduced, and thus it is possible to enhance radio frequency (RF) characteristics.

Figure 9:
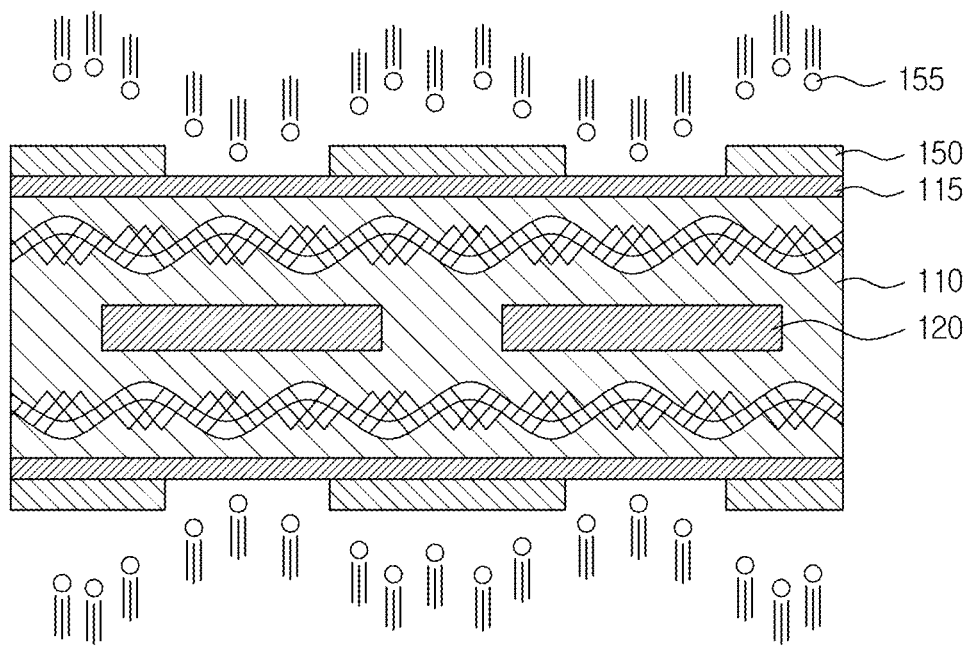

Referring to FIGS. 8 and 9, the via hole 112 may be formed by stacking, on the insulating layer 110 (and metal layer 115), a sandblast mask 150 with a through hole 152 formed to correspond to a location of the via hole 112 and then performing the sandblasting process on the insulating layer 110 on which the sandblast mask 150 is stacked. A portion of the insulating layer 110 covered with the sandblast mask 150 remains as it is while the via hole 112 is being processed. After the sandblasting process, the sandblast mask 150 may be removed.

By performing the sandblasting process on both surfaces of the insulating layer 110 to expose both surfaces of the center portion 122, a pair of via holes 112 facing each other with respect to the pad 120 may be formed.

Figure 10:
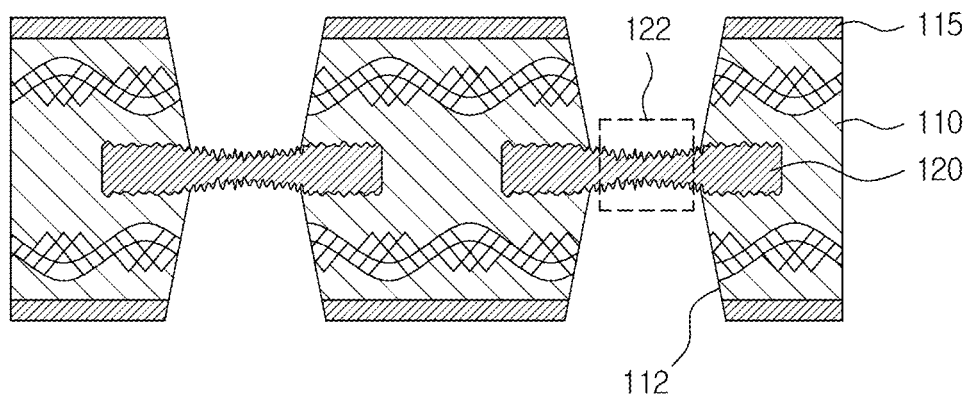

Referring to FIG. 10, the sandblasting process may also be performed on the pad 120 to have a higher roughness in the center portion 122 of the pad 120 than in peripheral portions simultaneously with or after the formation of the via hole 112. When the sandblasting process is performed on the pad 120, multiple valleys as well as the concave structure may be formed on the surface to increase roughness. That is, the center portion 122 exposed by the via hole 112 may have a higher roughness than a peripheral portion of the pad 120 buried in the insulating layer 110. The concave and highly rough surface of the sandblasted center portion 122 widens a surface area to be coupled to the via 130 and allows the via 130 to be inserted into and coupled to the pad 120 and thus may serve to increase coupling strength of the via 130 to the pad 120.

The sandblasting process may be simultaneously performed on both surfaces of the insulating layer 110 or may be sequentially performed on one surface and the other surface of the insulating layer 110. One or both surfaces of the center portion 122 of the pad 120 may be formed to be concave depending on the strength or order of the sandblasting process performed on both surfaces of the insulating layer 110. Also, the pad 120 may have one surface formed to be concave and the other surface formed to be convex.

The forming of the via 130 (S130) includes filling the via hole 112 with a metal material and forming the via 130.

Figure 11:
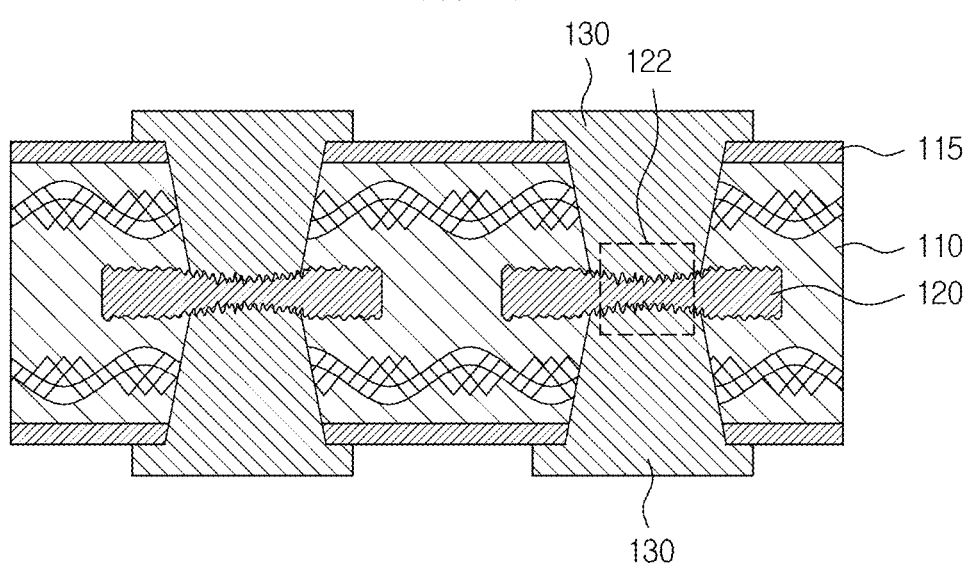

Referring to FIG. 11, the pair of vias 130 may be connected to the center portion 122 of the pad 120 to face each other. Accordingly, circuit patterns disposed on both surfaces of the insulating layer 110 may be reliably connected to each other through the pad 120 and the pair of vias 130.

Also, an end of the via 130 may be coupled to the concave center portion 122 of the pad 120. In this case, the center portion 122 has a high roughness, and thus a metal constituting the via 130 may be inserted into and coupled to a valley formed on the surface of the center portion 122 of the pad 120. Accordingly, this structure increases the coupling strength of the via 130 to the pad 120.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an insulating layer comprising a via hole formed therein;
a pad disposed in the insulating layer and comprising a single metal layer having peripheral portions disposed completely within the insulating layer and having a first roughness and a center portion that is exposed by the via hole, the center portion of the pad having a second roughness that is higher than the first roughness of the peripheral portions of the pad and being concave from the peripheral portions toward a center of the pad; and
a via formed in the via hole and connected to the center portion of the pad.

2. The printed circuit board of claim 1, wherein the center portion of the pad is concave on one surface.

3. The printed circuit board of claim 2, wherein the via hole comprises a pair of via holes formed in the insulating layer to face each other to expose both surfaces of the center portion of the pad, and
both surfaces of the center portion of the pad are concave, and the via comprises a pair of vias connected to the center portion of the pad to face each other.

4. The printed circuit board of claim 2, wherein the via hole comprises a pair of via holes formed in the insulating layer to face each other to expose both surfaces of the center portion of the pad, and
the center portion of the pad has a flat surface opposite the one surface, and the via comprises a pair of vias connected to the center portion of the pad to face each other.

5. The printed circuit board of claim 2, wherein the via hole comprises a pair of via holes formed in the insulating layer to face each other to expose both surfaces of the center portion of the pad, and
the center portion of the pad has a convex surface opposite the one surface, and the via comprises a pair of vias connected to the center portion of the pad to face each other.

6. A printed circuit board comprising:
an insulating layer;
a pad disposed in the insulating layer and comprising a first surface having a first center portion that is rougher than peripheral portions of the first center portion and that is concave from the peripheral portions of the first center portion toward a center of the first surface, and a second surface having a second center portion that is rougher than peripheral portions of the second center portion and that is concave from the peripheral portions of the second center portion toward a center of the second surface, the peripheral portions of the first center portion and the peripheral portions of the second center portion being disposed completely within the insulating layer;
a first via penetrating the insulating layer and connected to the first center portion of the pad; and
a second via penetrating the insulating layer and connected to the second center portion of the pad,
wherein the peripheral portions of the first center portion and the peripheral portions of the second center portions have a first roughness, and the first center portion and the second central portion have a second roughness higher than the first roughness.

7. The printed circuit board of claim 6, wherein the first center portion of the pad is concave toward the second center portion of the pad, and the second center portion of the pad is concave toward the first center portion of the pad.

8. The printed circuit board of claim 3, further comprising:
- a first circuit pattern disposed on a first surface of the insulating layer and electrically connected to a first via of the pair of vias; and
- a second circuit pattern disposed on a second surface of the insulating layer and electrically connected to a second via of the pair of vias.

9. The printed circuit board of claim 6, further comprising:
- a first circuit pattern disposed on a first surface of the insulating layer and electrically connected to the first via; and
- a second circuit pattern disposed on a second surface of the insulating layer and electrically connected to the second via.

10. The printed circuit board of claim 1, wherein the peripheral portions of the pad are disposed within a center portion of insulating layer such that the respective ends of the peripheral portions are disposed at a same level within the insulating layer.

* * * * *